United States Patent
Shioga et al.

(10) Patent No.: US 11,009,927 B2
(45) Date of Patent: May 18, 2021

(54) LOOP HEAT PIPE, METHOD OF MANUFACTURING THE SAME, AND ELECTRONIC DEVICE

(71) Applicant: SHINKO ELECTRIC INDUSTRIES CO., LTD., Nagano (JP)

(72) Inventors: Takeshi Shioga, Atsugi (JP); Yoshihiro Mizuno, Kobe (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 231 days.

(21) Appl. No.: 15/156,869

(22) Filed: May 17, 2016

(65) Prior Publication Data

US 2016/0259383 A1    Sep. 8, 2016

Related U.S. Application Data

(63) Continuation of application No. PCT/JP2013/083504, filed on Dec. 13, 2013.

(51) Int. Cl.
| | |
|---|---|
| *G06F 1/20* | (2006.01) |
| *F28D 15/02* | (2006.01) |
| *F28D 15/04* | (2006.01) |
| *H01L 23/427* | (2006.01) |
| *F28F 3/08* | (2006.01) |

(52) U.S. Cl.
CPC ......... *G06F 1/203* (2013.01); *F28D 15/0266* (2013.01); *F28D 15/043* (2013.01); *F28D 15/046* (2013.01); *H01L 23/427* (2013.01); *F28F 3/086* (2013.01); *H01L 2224/16225* (2013.01)

(58) Field of Classification Search
CPC .. F28D 15/0266; F28D 15/043; F28D 15/046; F28D 15/025; F28D 15/02; F28D 2021/0028; H01L 23/427; G06F 1/203; H04M 1/0202; F28F 1/006; F28F 13/08; F28F 3/086; H05K 7/20336
See application file for complete search history.

(56) References Cited

U.S. PATENT DOCUMENTS 4,170,262 A * 10/1979 Marcus ................. F28D 15/046
                                                    138/40
4,899,810 A *  2/1990 Fredley ................ B64G 1/506
                                                   165/104.14
(Continued)

FOREIGN PATENT DOCUMENTS

| | | |
|---|---|---|
| CN | 201463680 | 5/2010 |
| CN | 103335550 | 10/2013 |

(Continued)

OTHER PUBLICATIONS

JP-2002327993-A mt (Year: 2002).*

(Continued)

*Primary Examiner* — Gordon A Jones
(74) *Attorney, Agent, or Firm* — IPUSA, PLLC

(57) ABSTRACT

Disclosed loop heat pipe includes: an evaporator configured to vaporize a working fluid; a condenser configured to liquefy the working fluid; a liquid line connecting the evaporator and the condenser; a porous body provided in a columnar shape in the liquid line; and a vapor line connecting the evaporator and the condenser, and forming a loop together with the liquid line.

10 Claims, 17 Drawing Sheets

(56) References Cited

U.S. PATENT DOCUMENTS

| | | | | |
|---|---|---|---|---|
| 6,843,308 | B1* | 1/2005 | Duval | F28D 15/0233 |
| | | | | 165/104.26 |
| 6,880,625 | B2* | 4/2005 | Choi | F28D 15/043 |
| | | | | 165/104.21 |
| 8,611,089 | B2* | 12/2013 | Mizuta | F28D 15/0233 |
| | | | | 165/104.21 |
| 2003/0192674 | A1 | 10/2003 | Ippoushi et al. | |
| 2006/0157227 | A1* | 7/2006 | Choi | B82Y 30/00 |
| | | | | 165/104.21 |
| 2010/0044014 | A1* | 2/2010 | Ho | F28D 1/035 |
| | | | | 165/104.26 |
| 2012/0106084 | A1* | 5/2012 | Mizuta | F28D 15/0233 |
| | | | | 361/700 |
| 2012/0186784 | A1* | 7/2012 | Yang | F28D 15/0266 |
| | | | | 165/104.21 |

FOREIGN PATENT DOCUMENTS

| | | | |
|---|---|---|---|
| JP | 05-025164 | 4/1993 | |
| JP | 2002-327993 | 11/2002 | |
| JP | 2002327993 A * | 11/2002 | H01L 23/473 |
| JP | 2004-003816 | 1/2004 | |
| JP | 2007-113864 | 5/2007 | |
| JP | 2012-198019 | 10/2012 | |
| JP | 2013-011363 | 1/2013 | |
| WO | 2010014878 | 2/2010 | |

OTHER PUBLICATIONS

CNOA—Office Action of corresponding Chinese Patent Application No. 201380081515.2 dated Apr. 27, 2017, with full translation of the Office Action.
UPOA—Office Action dated Oct. 11, 2016 for corresponding to Japanese Patent Application No. 2015-552277, with partial English translation. ** All references cited in the JPOA were previously submitted in the IDS filed on May 17, 2016.
International Search Report and Written Opinion of the International Searching Authority (Form PCT/ISA/210, Form PCT/ISA/237), mailed in connection with PCT/JP2013/083504 and dated Feb. 18, 2014 (4 pages).
CNOA—Office Action of Chinese Patent Application No. 201380081515.2 dated Sep. 8, 2017, with full translation of the Office Action.

* cited by examiner comparative example present embodiment

LOOP HEAT PIPE, METHOD OF MANUFACTURING THE SAME, AND ELECTRONIC DEVICE

CROSS-REFERENCE TO RELATED APPLICATION(S)

This application is a continuation application of International Application PCT/JP2013/83504 filed on Dec. 13, 2013 and designated the U.S., the entire contents of which are incorporated herein by reference.

FIELD

The embodiments discussed herein are related to a loop heat pipe, a method of manufacturing the same, and an electronic device.

BACKGROUND

With the advent of an advanced information society, mobile electronic devices such as smartphones and tablet computers are widely used. Since the mobile electronic devices become thinner to be easily carried, it is difficult to provide a fan and a blower to cool heat generating components such as a CPU (Central Processing Unit).

As an example of a method of cooling the heat generating components, there is a method of transferring heat of the heat generating components to the outside using a metallic plate or a heat spreading sheet with high thermal conductivity. In this method, however, heat transfer is limited by the thermal conductivity of the metallic plate and the heat spreading sheet. For example, graphite sheets used as the heat spreading sheets have a thermal conductivity of about 500 W/mK to 1500 W/mK. With the thermal conductivity on that order, it is difficult to cool the heat generating components when the amount of heat of the heat generating components becomes large.

To deal with this problem, heat pipes are under consideration in order to cool actively the heat generating components.

The heat pipe is a device which transfers heat using a phase change of a working fluid, and has a thermal conductivity higher than that of the heat spreading sheet described above. For example, a heat pipe with a diameter of 3 mm exhibits a high thermal conductivity of about 1500 W/mK to 2500 W/mK.

Several types of heat pipes are available. A loop heat pipe includes an evaporator configured to vaporize the working fluid with use of the heat from the heat generating components and a condenser configured to cool the thus-vaporized working fluid into a liquid. The evaporator and the condenser are connected to each other via a liquid line and a vapor line which form a loop-shaped flow path, and the working fluid flows through the flow path in a one-way direction.

Since the working fluid of the loop heat pipe flows in the one-way direction as described above, the loop heat pipe gives lower resistance to the working fluid than the conventional heat pipe in which the working fluid in a liquid phase and the vapor thereof flow back and forth through the line, and thus achieves efficient heat transfer.

Note that technologies related to the present application are disclosed in Japanese National Publication of International Patent Application No. 2011-530059, Japanese Laid-open Patent Publication No. 2004-3816, and Japanese Laid-open Utility Model Publication No. 05-25164.

SUMMARY

According to one aspect discussed herein, there is provided a loop heat pipe including: an evaporator configured to vaporize a working fluid; a condenser configured to liquefy the working fluid; a liquid line connecting the evaporator and the condenser; a porous body provided in a columnar shape in the liquid line; and a vapor line connecting the evaporator and the condenser, and forming a loop together with the liquid line.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to a description of the present embodiment, studies conducted by the inventor of the present application will be described.

Figure 1:
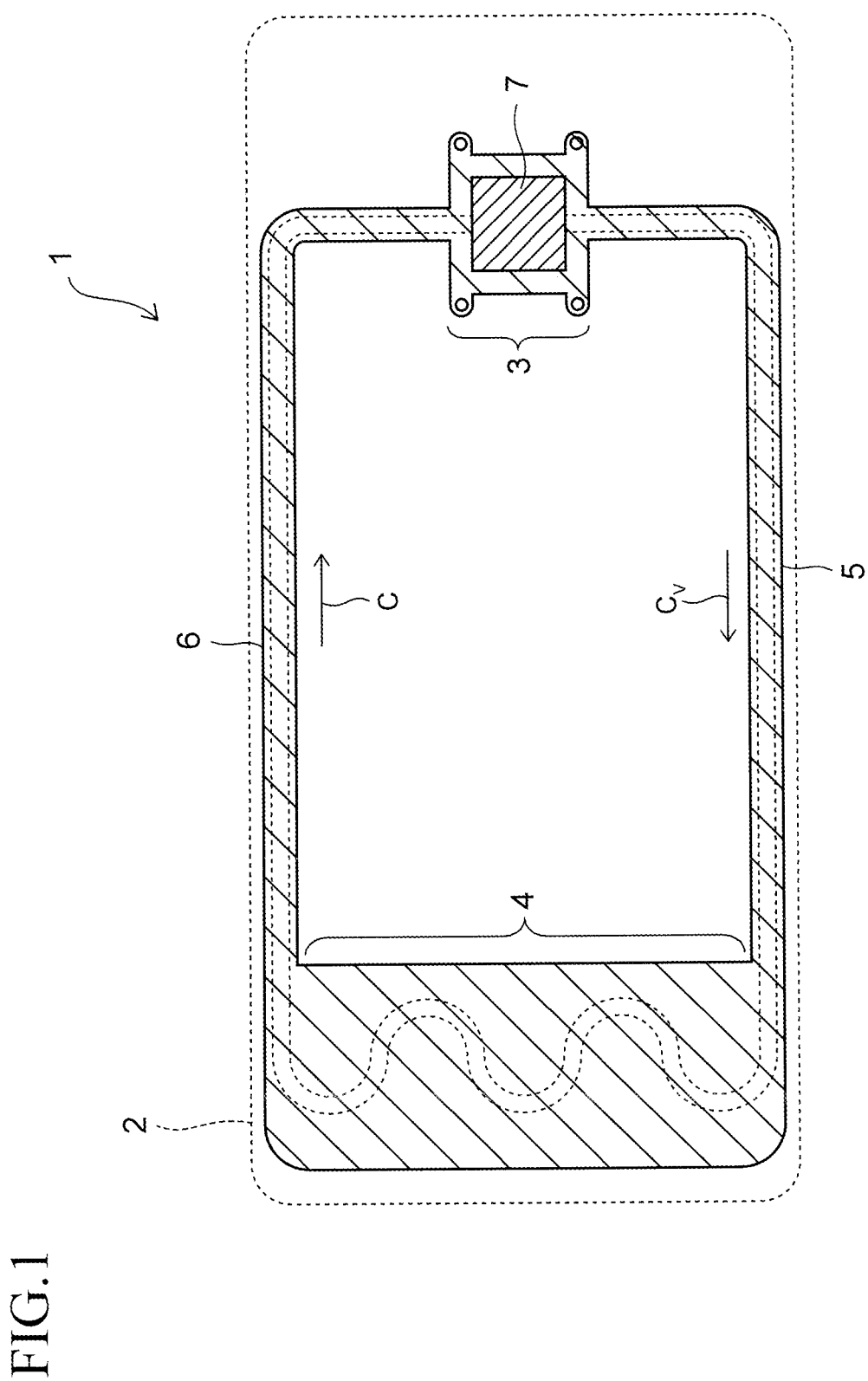
FIG. 1 is a schematic diagram of a loop heat pipe used in a study.

FIG. 1 is a schematic diagram of a loop heat pipe used in the study.

The loop heat pipe 1 is placed in a mobile electronic device 2 such as a smartphone, and includes an evaporator 3 and a condenser 4.

A vapor line 5 and a liquid line 6 are connected to the evaporator 3 and the condenser 4. The vapor line 5 and the liquid line 6 form a loop-shaped flow path through which working fluid C flows. In addition, a heat generating component 7 such as a CPU is fixed on the evaporator 3, and the heat of the heat generating component 7 generates vapor Cv of the working fluid C. The vapor Cv flows through the vapor line 5 to the condenser 4, and then is liquefied in the condenser 4. Thus, the heat generated from the heat generating component 7 is transferred to the condenser 4.

Figure 2:
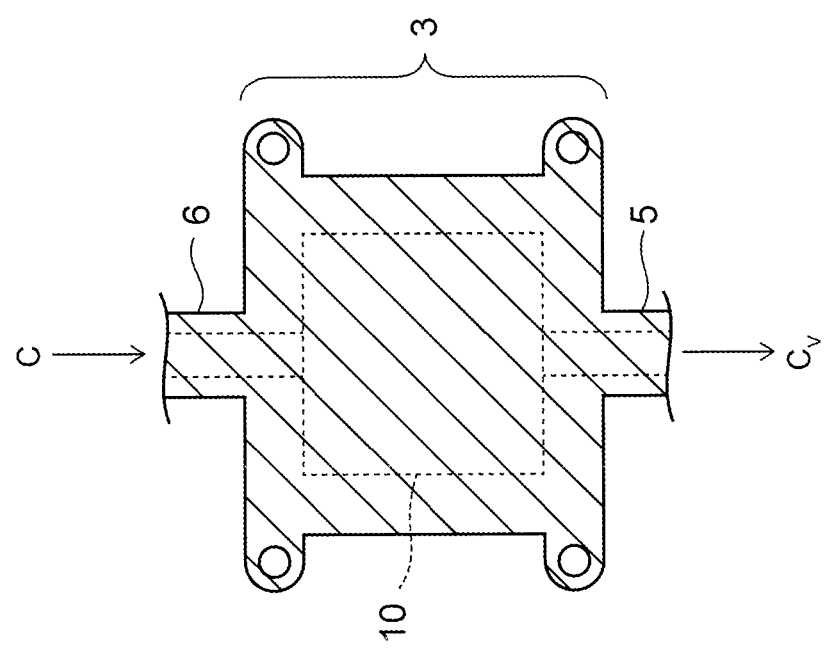
FIG. 2 is an enlarged plan view of an evaporator and its vicinity of the loop heat pipe used in the study.

FIG. 2 is an enlarged plan view of the evaporator 3 and its vicinity.

As illustrated in FIG. 2, a wick 10 is placed in the evaporator 3. Ideally, a portion of the wick 10 near the liquid line 6 is impregnated with the working fluid in a liquid phase.

When such a state is maintained, capillary force from the wick 10 acts on the working fluid C in the liquid phase, and the capillary force resists against the vapor Cv of the working fluid C. Therefore, the working fluid C in the liquid phase can be expected to function as a check valve which prevents the vapor Cv from flowing back from the vapor line 5 to the liquid line 6.

However, according to the studies conducted by the inventor of the present application, it was found that the vapor Cv flows back in the evaporator 3 when the loop heat pipe 1 is made thinner.

One conceivable reason for this is that the thinning increases a pressure loss in the vapor line 5 so much that the flow of the vapor Cv stagnates in the vapor line 5, and the vapor Cv is no longer capable of pushing out the working fluid C in the liquid phase in the condenser 4 (see FIG. 1) to the liquid line 6.

Another conceivable reason is that the heat generating component 7 heats the liquid line 6 and thereby vaporizes part of the working fluid C in the liquid line 6, which in turn causes a backward flow of the vapor Cv described above. Note that a phenomenon in which the liquid line 6 is heated by the heat generating component 7 in this manner is also referred to as heat leak.

When the vapor Cv flows back as described above, heat transfer performance of the loop heat pipe significantly decreases, and it becomes difficult to cool the heat generating component 7.

The present embodiment, which is capable of preventing a backward flow of the working fluid even when thinned, will be described.

Present Embodiment

Figure 3:
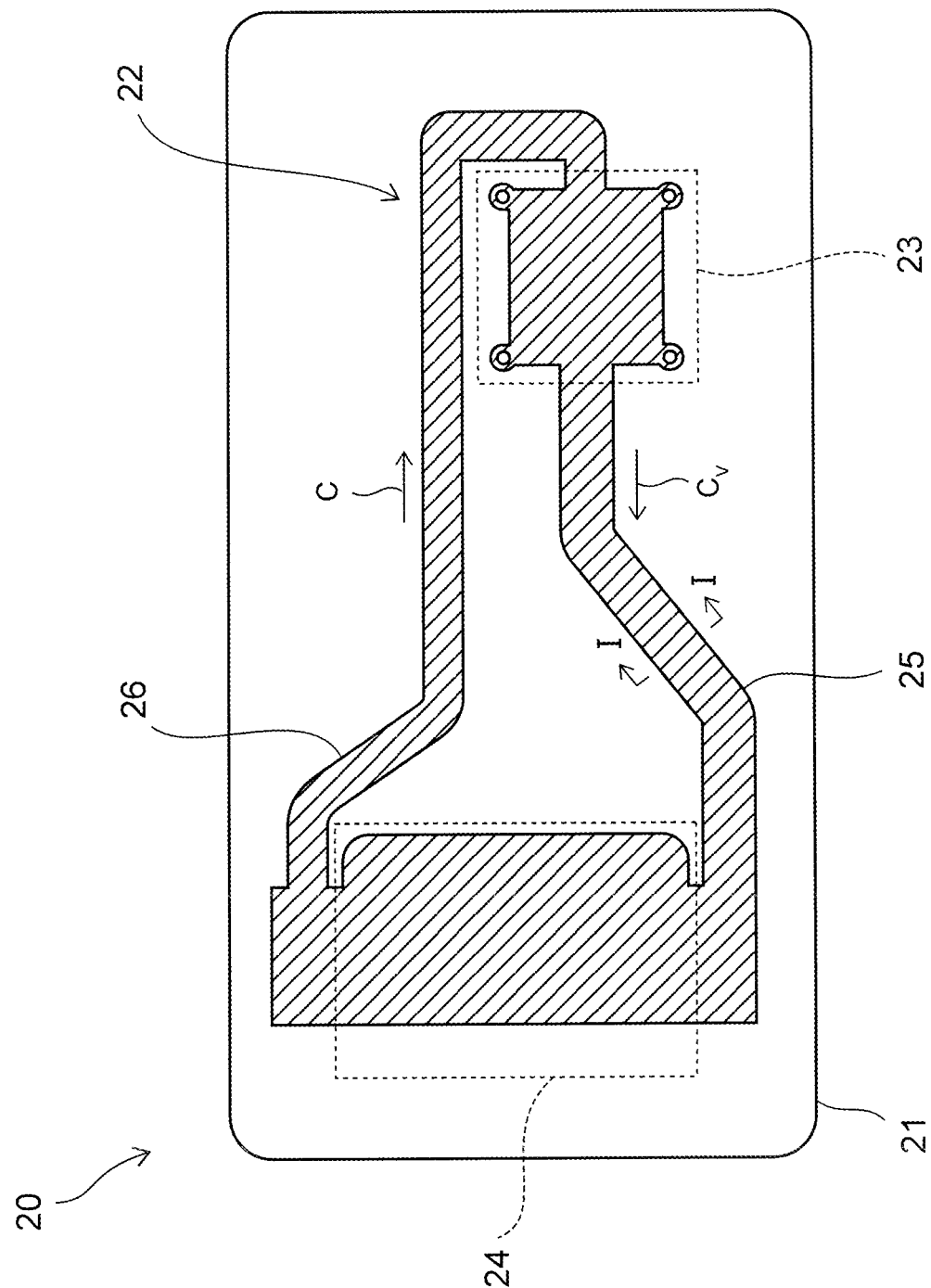
FIG. 3 is a schematic plan view of an electronic device according to the present embodiment.

FIG. 3 is a schematic plan view of an electronic device according to the present embodiment.

The electronic device 20 is a mobile electronic device such as a smartphone and a tablet computer, and includes a housing 21 and a loop heat pipe 22 housed in the housing 21.

The loop heat pipe 22 includes an evaporator 23 configured to generate the vapor Cv of the working fluid C, and a condenser 24 configured to liquefy the working fluid C. In addition, a vapor line 25 and a liquid line 26 are connected to the evaporator 23 and the condenser 24, and the lines 25 and 26 form a loop-shaped flow path through which the working fluid C flows.

Figure 4:
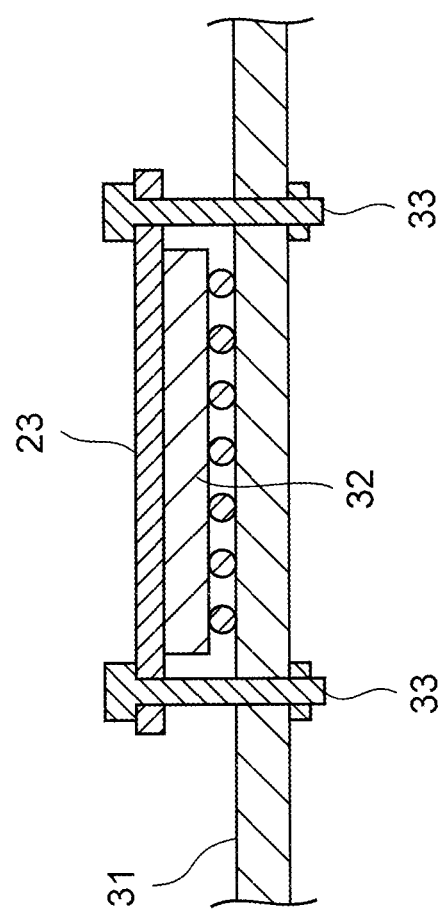
FIG. 4 is a cross-sectional view of an evaporator and its vicinity of a loop heat pipe according to the present embodiment.

FIG. 4 is a cross-sectional view of the evaporator 23 and its vicinity.

As illustrated in FIG. 4, the evaporator 23 is fixed on a circuit board 31 with screws 33. A heat generating component 32 such as a CPU is mounted on the circuit board 31, and a surface of the heat generating component 32 is in contact with the evaporator 23. This makes it possible for the heat generating component 32 to vaporize the working fluid C in the evaporator 23.

The kind of the working fluid C is not particularly limited. However, in order to cool the heat generating component 32 efficiently with latent heat of vaporization, it is preferable to use such a fluid as the working fluid C that has high vapor pressure and high latent heat of vaporization. Such a fluid includes ammonium, water, fluorocarbon, alcohol, and acetone.

Figure 5:
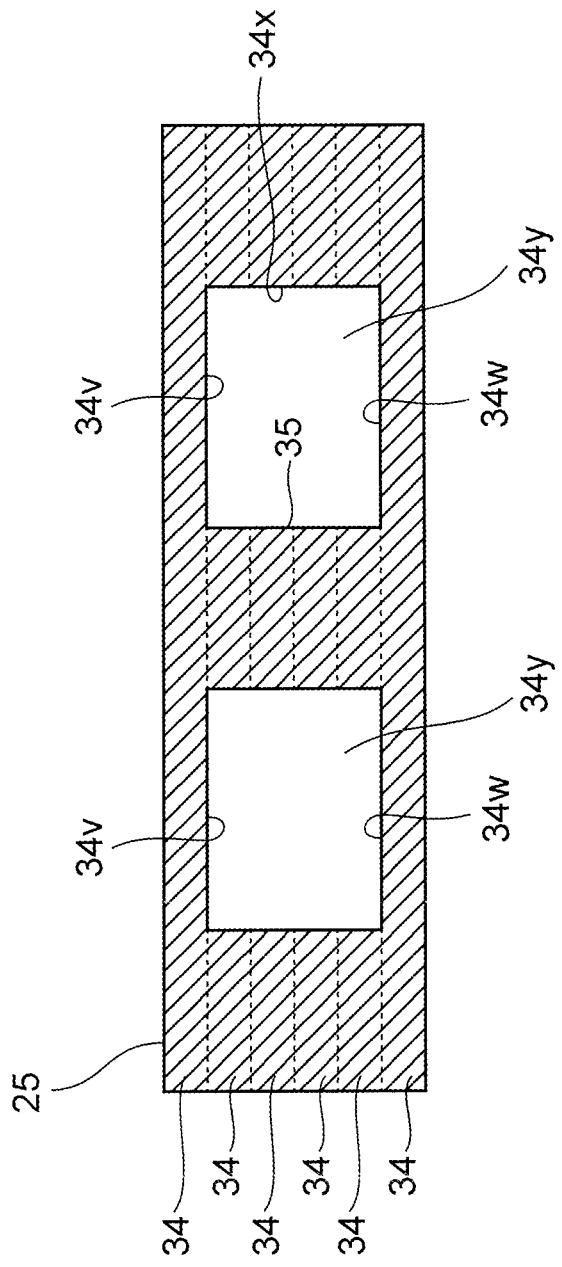
FIG. 5 is a cross-sectional view taken along line I-I in FIG. 3.

FIG. 5 is a cross-sectional view taken along line I-I in FIG. 3, and corresponds to a cross-sectional view of the vapor line 25.

As illustrated in FIG. 5, the vapor line 25 is formed by stacking six metallic layers 34, for example. Each metallic layer 34 is made of, for example, copper with excellent thermal conductivity and is bonded to one another by diffusion bonding. In addition, a thickness of each of the metallic layers 34 is about 0.1 mm to 0.3 mm.

Note that stainless layers or magnesium alloy layers may be employed as the metallic layers 34 in place of the copper layers. It should be noted that materials of all of the metallic layers 34 are preferably the same in order to excellently bond the metallic layers 34 by the diffusion bonding.

Moreover, the number of the metallic layers 34 to be stacked is not limited to the above. The number of the metallic layers 34 to be stacked may be equal to or less than five, or equal to or greater than seven.

Then, the metallic layers 34 define a base surface 34w, a ceiling surface 34v, and walls 34x of the vapor line 25.

In addition, a pillar 35 is provided in the vicinity of the center of the vapor line 25. The pillar 35 supports the ceiling surface 34v of the vapor line 25 from below, and prevents collapse of the vapor line 25 due to pressing force exerted in the process of stacking the metallic layers 34. This ensures the provision of a flow path 34y which allows the vapor Cv to flow in the vapor line 25 even when the loop heat pipe 22 is thinned. As a consequence, the vapor Cv can flow smoothly in the loop heat pipe 22.

Note that the evaporator 23, the condenser 24, and the vapor line 25 are also formed by stacking the metallic layers as described above.

Figure 6:
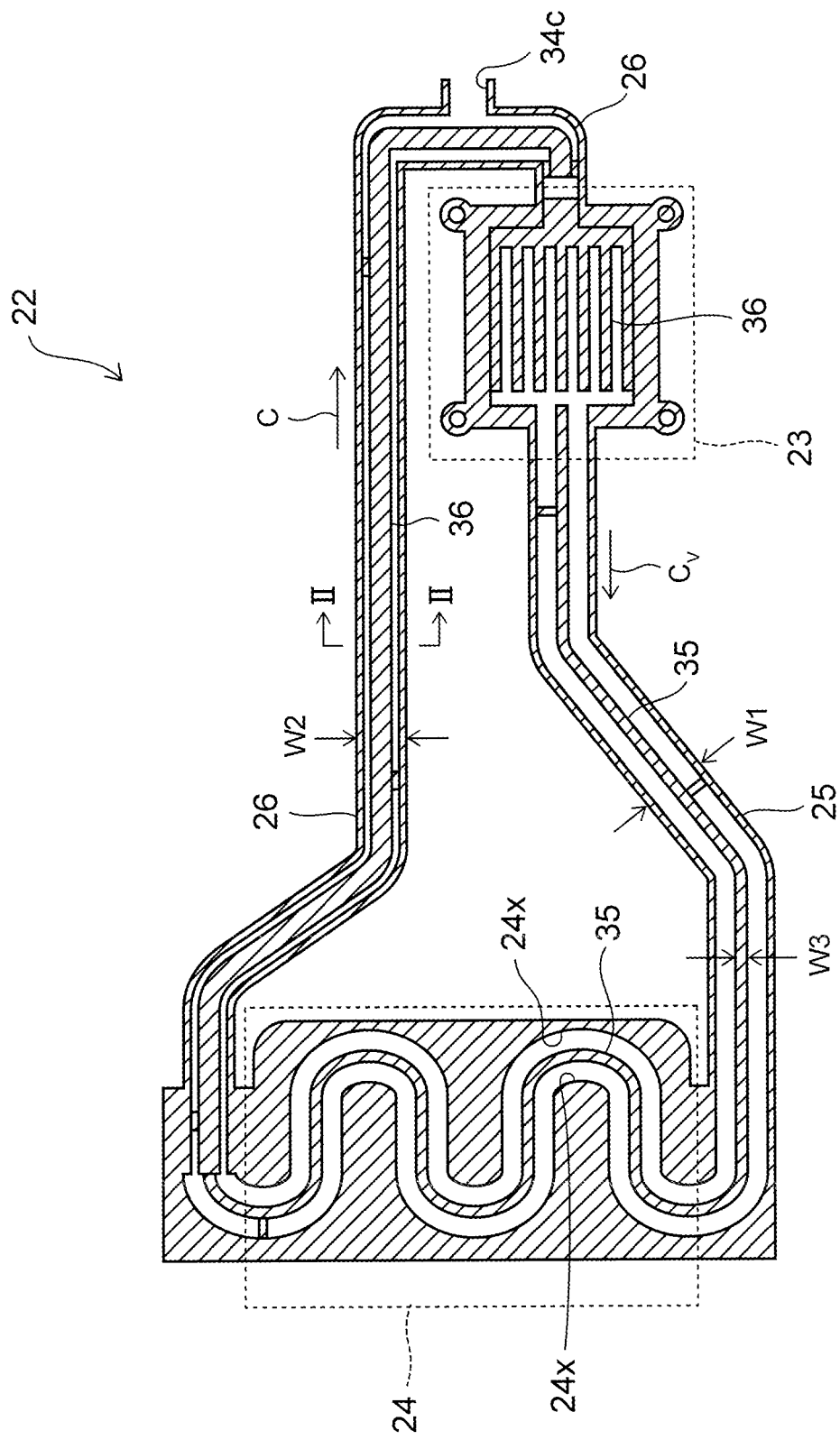
FIG. 6 is a schematic plan view of the loop heat pipe in which an uppermost metallic layer is omitted in the present embodiment.

FIG. 6 is a schematic plan view of the loop heat pipe 22 from which the uppermost metallic layer 34 is omitted.

Dimensions of the loop heat pipe 22 are not particularly limited. In this example, a width W1 of the vapor line 25 is about 8 mm, and a width W2 of the liquid line 26 is about 6 mm.

In addition, a planar shape of the pillar 35 is a linear shape extending along the vapor line 25. This allows the vapor Cv to flow smoothly in the vapor line 25 along the pillar 35. Here, a width W3 of the pillar 35 is about 1 mm.

A flow path 24x for the working fluid C is provided in the condenser 24. Each ends of the flow path 24x are connected to the vapor line 25 and the liquid line 26 respectively. The pillar 35 is also provided in the flow path 24x and can prevent collapse of the flow path 24.

In addition, a porous body 36 is placed in the liquid line 26. The porous body 36 extends along the liquid line 26 toward the vicinity of the evaporator 23. The working fluid C in the liquid phase in the liquid line 26 is guided to the evaporator 23 with the assistance of capillary force generated in the porous body 36.

Consequently, even when the vapor Cv attempts to flow back in the liquid line 26 due to heat leak from the evaporator 23 and the like, it is possible to push back the vapor Cv with the assistance of the aforementioned capillary force exerted by the porous body 36 on the working fluid C in liquid phase. Thus, the backward flow of the vapor Cv can be prevented.

The porous body 36 is placed in the evaporator 23.

In the evaporator 23, a portion of the porous body 36 near the liquid line 26 is impregnated with the working fluid C in the liquid phase. Here, the capillary force exerted by the porous body 36 on the working fluid C serves as pumping force which circulates the working fluid C through the loop heat pipe 22.

Moreover, this capillary force resists against the vapor Cv in the evaporator 23. Thus, it is possible to suppress a backward flow of the vapor Cv toward the liquid line 26.

Note that in the liquid line 26, an inlet 34c is formed through which the working fluid C is poured. The inlet 34c is sealed with an unillustrated seal member, and the inside of the loop heat pipe 22 is thus kept sealed.

Figure 7:
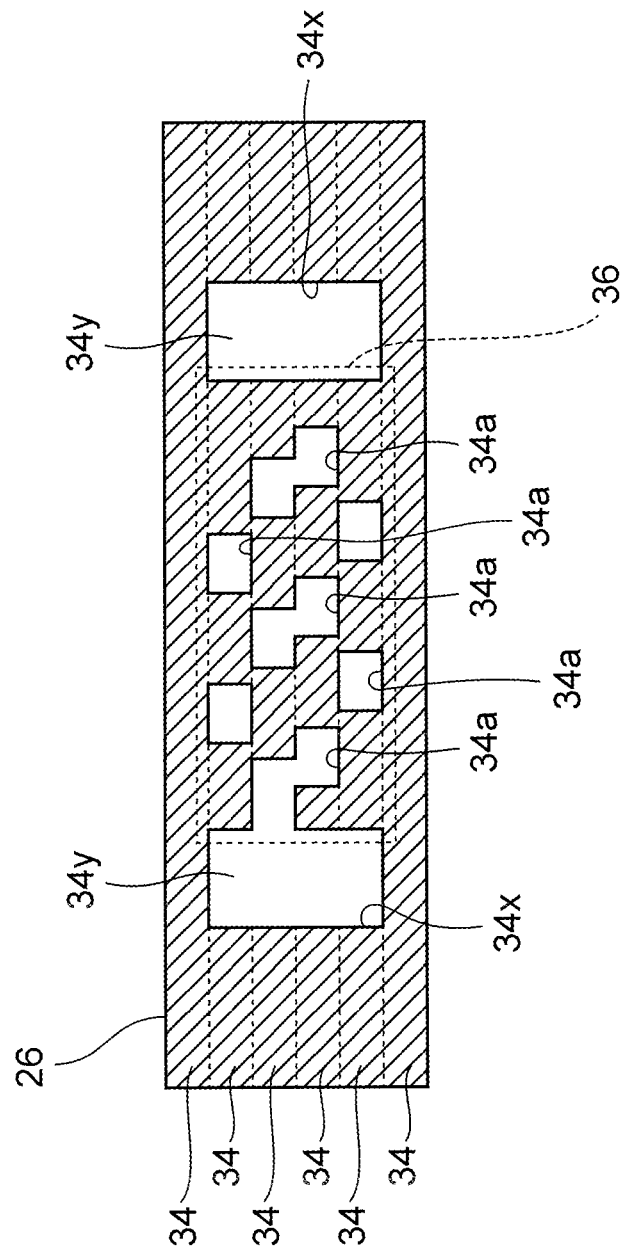
FIG. 7 is a cross-sectional view of a liquid line of the loop heat pipe according to the present embodiment.

FIG. 7 is a cross-sectional view of the liquid line 26, and corresponds to a cross-sectional view taken along line II-II in FIG. 6.

As illustrated in FIG. 7, the entire porous body 36 is provided in a columnar shape in the cross-sectional view. Thus, the porous body 36 can prevent collapse of the liquid line 26 due to pressing force exerted when the metallic layers 34 are stacked.

In addition, multiple pores 34a are provided in a portion of the metallic layers 34 that corresponds to the porous body 36. Adjacent pores 34a communicate with each other, and fine channels are thus defined by the pores 34a. The channels extend three-dimensionally in the porous body 36, and the working fluid C permeates the channels three-dimensionally with the assistance of the capillary force.

Here, the position of the porous body 36 in the liquid line 26 is not particularly limited. However, it is preferable to provide the porous body 36 away from the wall 34x of the liquid line 26, as illustrated in FIG. 7. Thereby, a fine channel 34y through which the working fluid C flows is formed between the porous body 36 and the wall 34x, which makes it easier for the working fluid C to flow in the liquid line 26.

Figure 8:
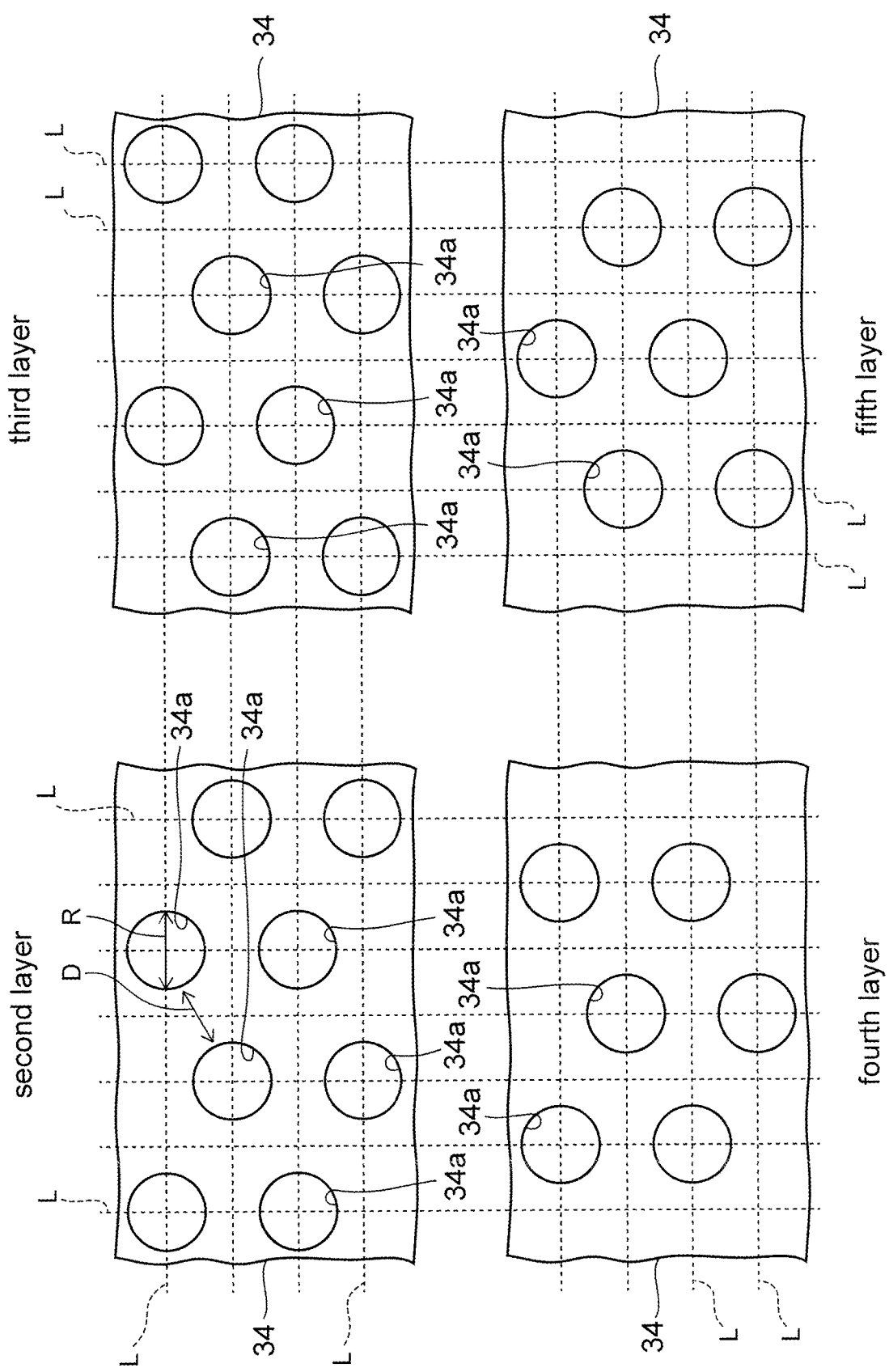
FIG. 8 is a plan view illustrating pores in the second to fifth layers of the metallic layer in the loop heat pipe according to the present embodiment.

FIG. 8 is a plan view illustrating the pores 34a of the second to the fifth layers of the metallic layers 34.

In the example of FIG. 8, a shape of each of the pores 34a is circular. Then, these pores 34a are provided at intersections of imaginary lines L that are perpendicular to one another.

Here, a diameter R of the pore 34a and a distance D between adjacent pores 34a may be optimized by taking into consideration an amount of the transferred heat and the heat transfer distance required for the loop heat pipe 22, a height of the each of the vapor line 25 and the liquid line 26, and the like.

Moreover, the shape of the pore 34a is not limited to a circle. The pore 34a may be formed in any shape such as an ellipse and a polygon.

In addition, the positions of the pores 34a are different among the second layer to the fifth layer of the metallic layers 34.

Figure 9:
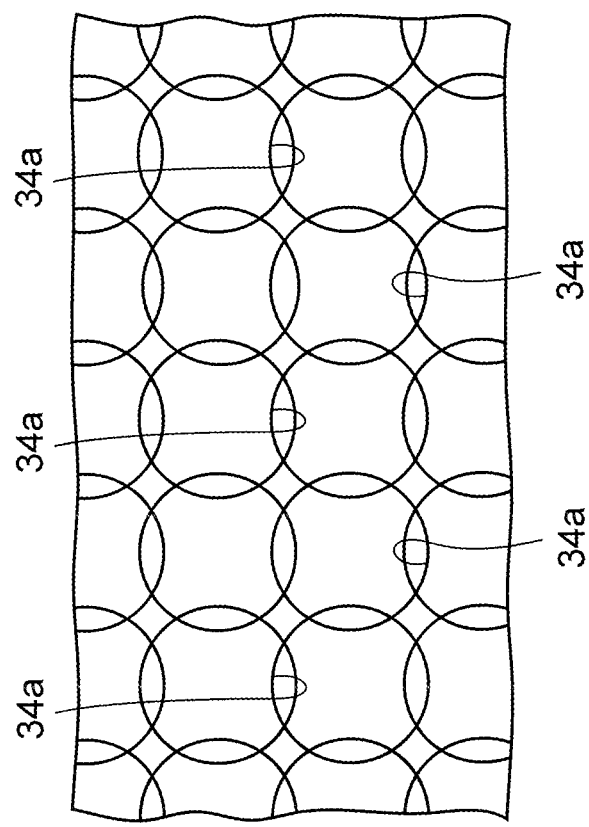
FIG. 9 is a plan view schematically lustrating a position of each of the pores in the stacked metallic layers in the present embodiment.

FIG. 9 is a plan view schematically illustrating the positions of the pores 34a when the metallic layers 34 are stacked.

Since the positions of the pores 34a are different among the metallic layers 34 as described above, the pores 34a overlap one another in a plan view, as illustrated in FIG. 9.

It is not particularly limited how the pores 34a overlap each other. In this example, in the two metallic layers 34 vertically adjacent to each other, at least a part of the pore 34a in one metallic layers 34 overlaps the pore 34a in the other metallic layer 34. This allows the working fluid C to flow three-dimensionally through the pores 34a in the vertically adjacent metallic layers 34.

Although FIG. 9 illustrates the case where the size of all the pores 34a in all of the metallic layers 34 is the same, the size of the pores 34a is not limited to this.

Figure 10:
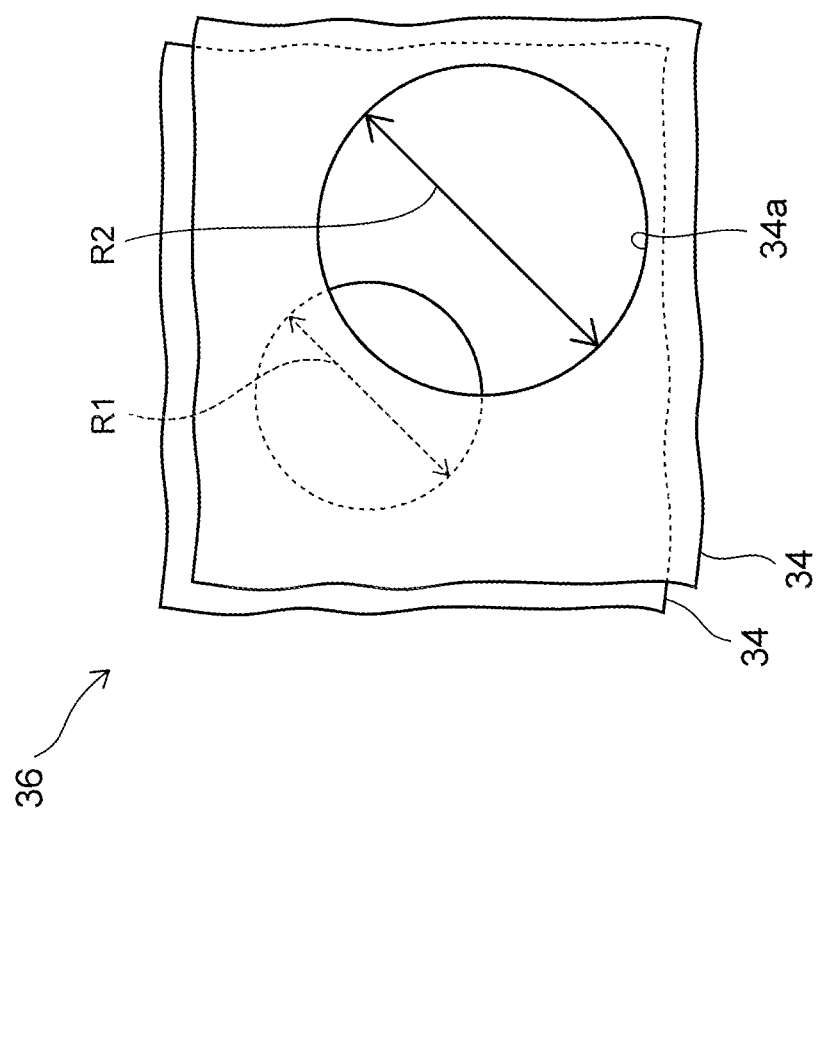
FIG. 10 is a plan view illustrating another example of a size of the pore in the present embodiment.

FIG. 10 is a plan view illustrating another example of the size of the pore 34a.

In the example of FIG. 10, in the two metallic layers 34 vertically adjacent to each other, a diameter R1 of the pore 34a in one metallic layers 34 is different from a diameter R2 of the pore 34a in the other metallic layer 34.

By making the size of the pores 34a different between the vertically adjacent metallic layers 34 in this manner, the capillary force exerted by the porous body 36 on the working fluid C can be adjusted Meanwhile, as described above, the porous body 36 is also provided in the evaporator 23. The size of the pores 34a in the evaporator 23 may be different from that in the liquid line 26 as described below.

Figure 11A:
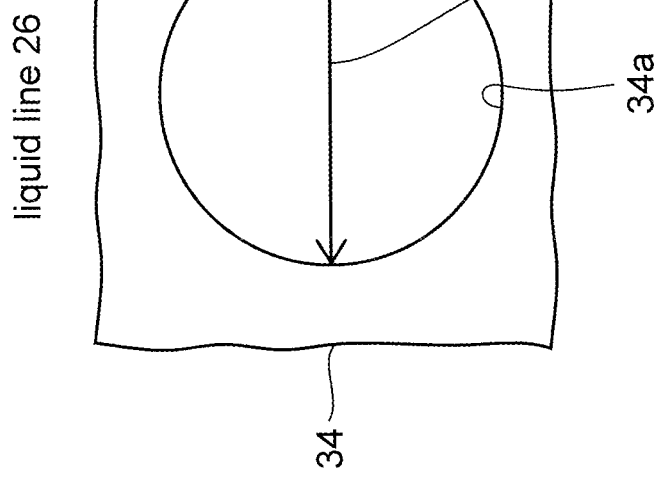
FIG. 11A is a schematic plan view illustrating an example of the size of the pore in the evaporator according to the present embodiment.
Figure 11B:
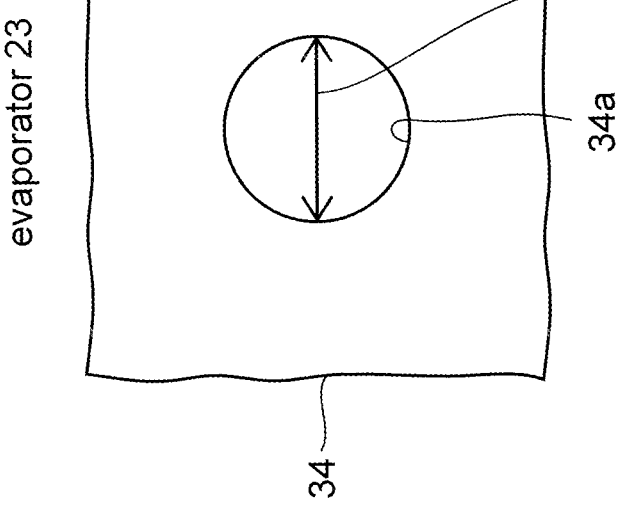
FIG. 11B is a schematic plan view illustrating an example of the size of the pore in the liquid line according to the present embodiment.

FIG. 11A is a schematic plan view illustrating an example of the size of the pore 34a in the evaporator 23, and FIG. 11B is a schematic plan view illustrating an example of the size of the pore 34a in the liquid line 26.

In the example of FIGS. 11A and 11B, a diameter R3 of the pore 34a in the evaporator 23 is made smaller than a diameter R4 of the pore 34a in the liquid line 26.

In this case, the working fluid C can flow smoothly through the larger pores 34a in the liquid line 26, and can be transferred rapidly to the evaporator 23. In the evaporator 23, on the other hand, the working fluid C in the liquid phase serves as check valves with the assistance of the capillary force exerted by the smaller pores 34a. Hence, it is possible to effectively suppress a backward flow of the vapor Cv as described above.

Next, a study conducted by the inventor of the present application will be described.

Figure 12A:
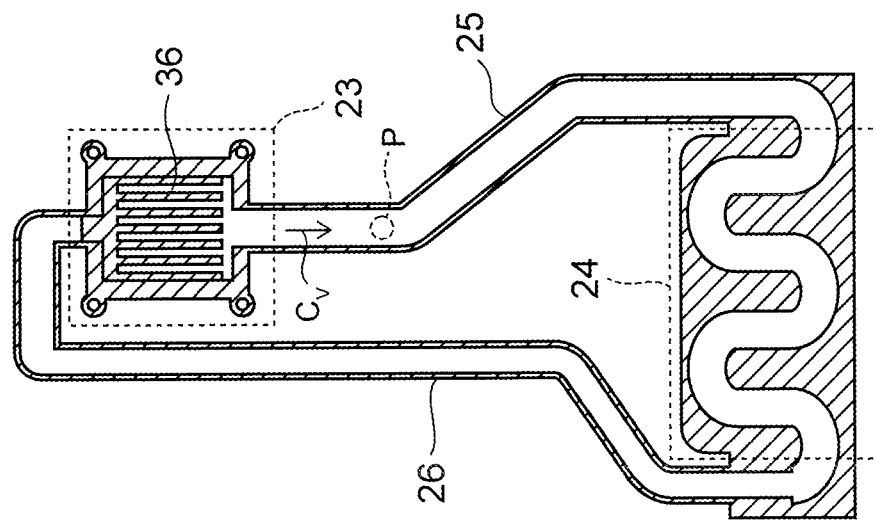
FIG. 12A is a schematic plan view of a loop heat pipe according to a comparative example.
Figure 12B:
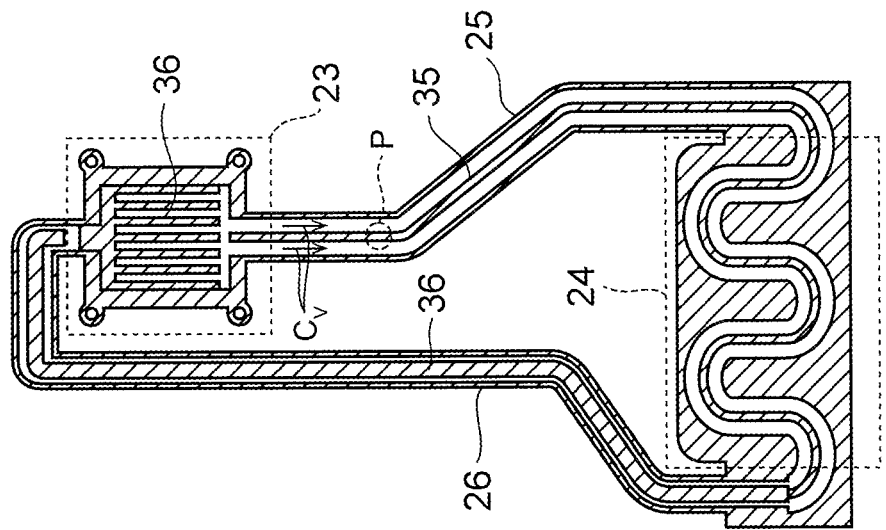
FIG. 12B is a schematic plan view of the loop heat pipe according to the present embodiment.

FIGS. 12A and 12B are schematic plan views of loop heat pipes used in this study.

FIG. 12A is a schematic plan view of a loop heat pipe according to a comparative example. In this comparative example, the porous body 36 is not provided in the liquid line 26, and the pillar 35 also is not provided in the vapor line 25.

On the other hand, FIG. 12B is a schematic plan view of the loop heat pipe according to the present embodiment. In the present embodiment, as described above, the porous body 36 is provided in the liquid line 26, and the pillar 35 is provided in the vapor line 25.

In this study, a measurement point P for measuring a temperature was provided in each of the loop heat pipes of the comparative example and the present embodiment. Then, a temperature of the vapor Cv immediately after emission from the evaporator 23 was measured at each measurement point P.

Figure 13:
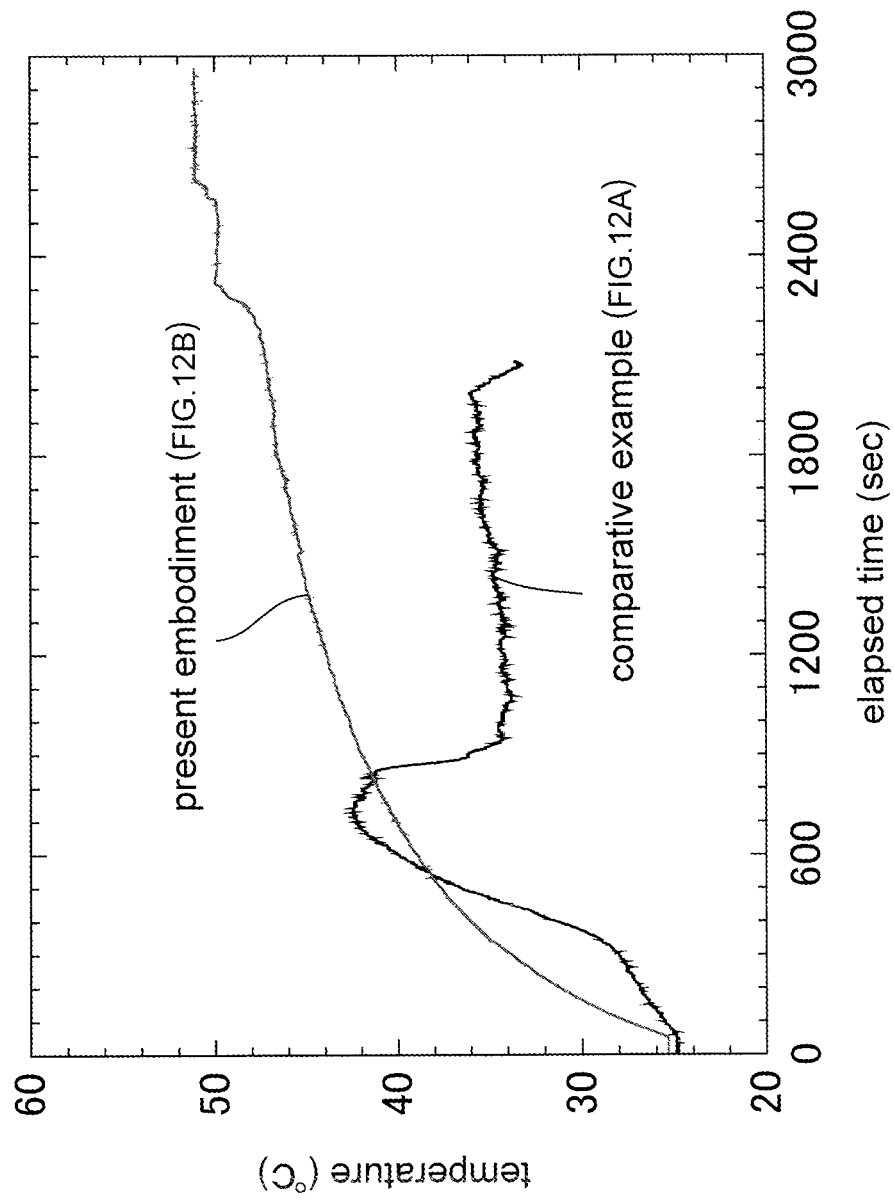
FIG. 13 is a graph obtained by measuring a temperature of vapor immediately after emission from the evaporator in each of the comparative example and the present embodiment.

Measurement results are given in FIG. 13. A horizontal axis of FIG. 13 represents the elapsed time from the time point when an unillustrated heat source started to heat the evaporator 23. Meanwhile, a vertical axis of FIG. 13 represents a temperature of the measurement point P. In addition, water was used as the working fluid C in both the comparative example and the present embodiment.

In the comparative example, as illustrated in FIG. 13, the temperature successfully increases during the time period of the elapsed time of 0 seconds to 600 seconds, but decreases sharply when the elapsed time exceeds 800 seconds. The reason for this is considered as follows. That is, during the time period of 0 seconds to 600 seconds, the vapor Cv of the working fluid C generated in the evaporator 23 passed the measurement point P and thus the temperature rose.

In contrast, when the time exceeds 800 seconds, the vapor Cv flowed back through the vapor line 25, and the generating point P is no longer heated by the vapor Cv.

On the other hand, the present embodiment did not exhibit a decrease in temperature as observed in the comparative example. Hence it follows that the vapor Cv did not flow back through the vapor line 25, and the measurement point P was heated by the vapor Cv at all times.

From these results, it was confirmed that it is possible to suppress the backward flow of the vapor Cv by providing the porous body 36 in the liquid line 26 as in the present embodiment.

Next, a method of manufacturing the loop heat pipe 22 according to the present embodiment will be described.

Figure 14:
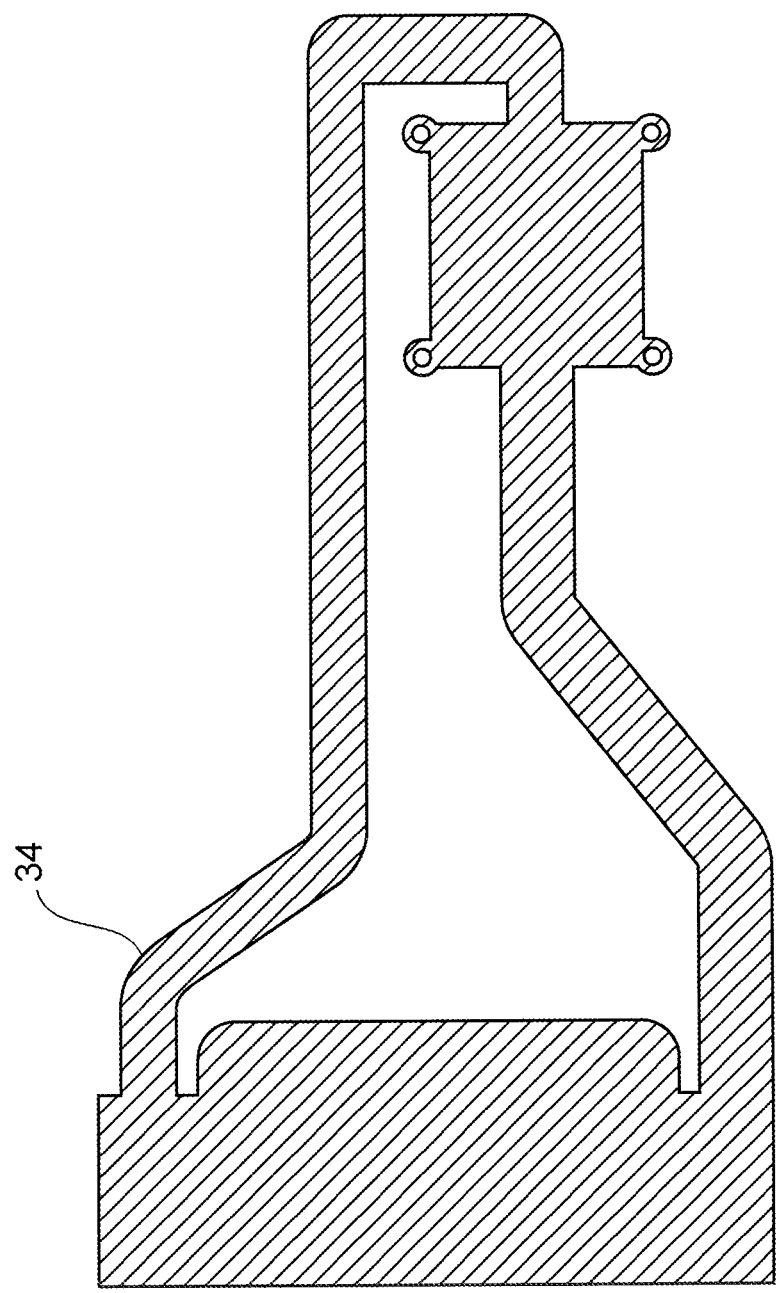
FIG. 14 is a (first) plan view of the metallic layer used in the manufacture of the loop heat pipe according to the present embodiment.
Figure 15:
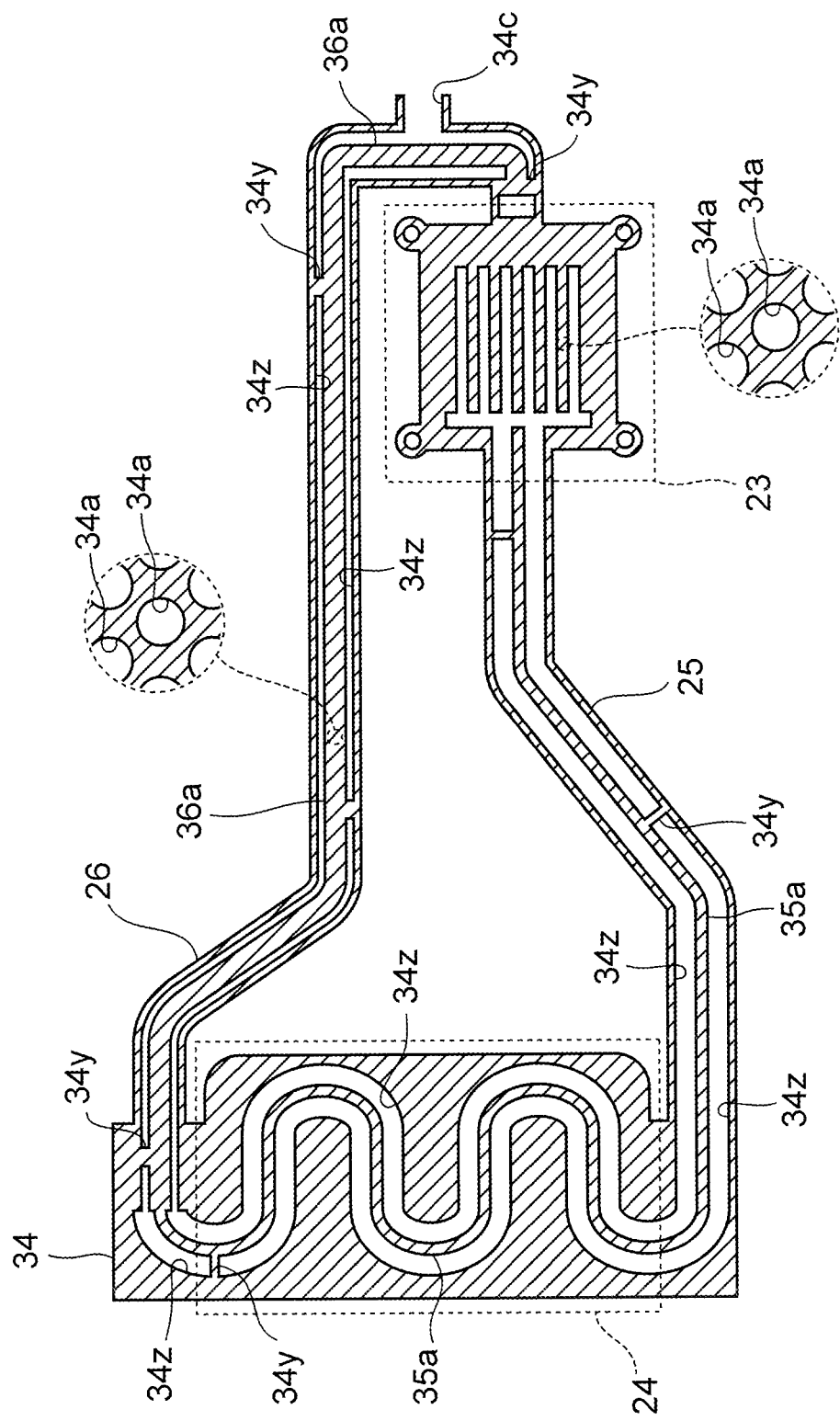
FIG. 15 is a (second) plan view of the metallic layer used in the manufacture of the loop heat pipe according to the present embodiment.

FIG. 14 and FIG. 15 are plan views of the metallic layer 34 used for manufacturing the loop heat pipe 22.

FIG. 14 is a plan view of the metallic layer 34 used for the uppermost layer and the lowermost layer of the loop heat pipe 22. FIG. 15 is a plan view of the metallic layer 34 provided between the uppermost layer and the lowermost layer.

The metallic layers 34 illustrated in FIG. 14 and FIG. 15 can be fabricated, for example, by wet-etching a copper layer of thickness of about 0.1 mm and patterning the copper layer into a predetermined shape.

In addition, in this wet etching, openings 34z are formed in the metallic layers 34 as illustrated in FIG. 15. The openings 34z have shapes that corresponds to the evaporator 23, the condenser 24, the vapor line 25, and the liquid line 26 of the loop heat pipe 22.

Further, a part 36a of the porous body 36 is provided in a portion of the metallic layers 34 that corresponds to the liquid line 26. Then, the multiple pores 34a are formed by the aforementioned wet etching in the part 36a and in the evaporator 23.

On the other hand, a part 35a of the pillar 35 is provided in a portion of the metallic layers 34 that corresponds to the vapor line 25.

Here, the parts 35a and 36a are connected to the metallic layers 34 by bridges 34y, and are thus prevented from detaching from the metallic layer 34. In order to prevent the bridges 34y from closing the vapor line 25 and the liquid line 26, it is preferable that the positions of the bridges 34y be made different among the metallic layers 34.

In addition, in the portion of metallic layer 34 that corresponds to the liquid line 26, an inlet 34c is provided for pouring the working fluid C.

Figure 16:
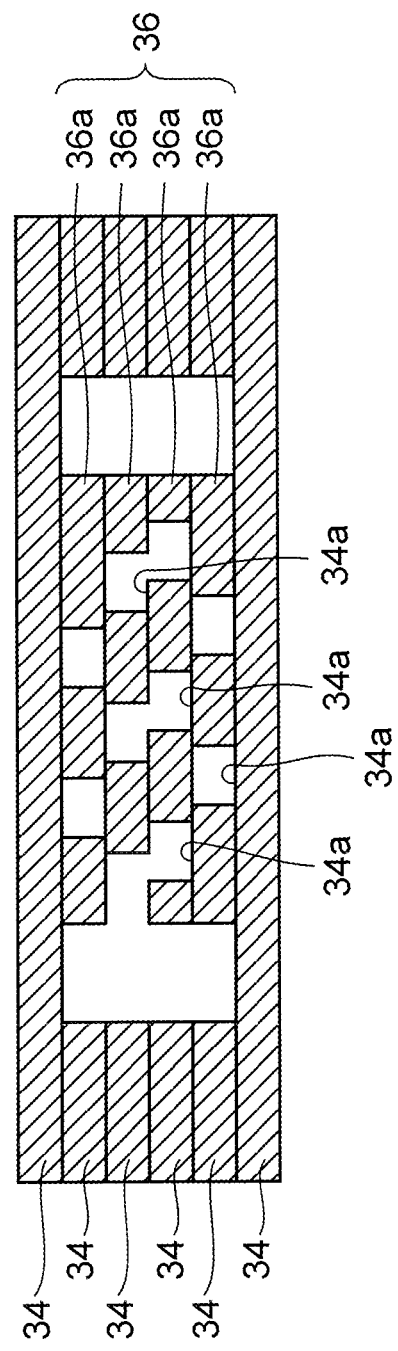
FIG. 16 is a cross-sectional view of the loop heat pipe in the course of manufacturing according to the present embodiment.

Then, as illustrated in FIG. 16, the multiple metallic layers 34 described above are stacked. FIG. 16 is a cross-sectional view of the portion that corresponds to the liquid line 26 after the stacking.

In this stacking, the metallic layers 34 illustrated in FIG. 14 are disposed as the uppermost layer and the lowermost layer, and the multiple metallic layers 34 illustrated in FIG. 15 are arranged between the uppermost layer and the lowermost layer.

Subsequently, the metallic layers 34 are pressed against each other while heating the metallic layers 34 at around 900° C. Thereby, the metallic layers 34 are bonded together by diffusion bonding. At this time, since the porous body 36 functions as a pillar as described above, it is possible to prevent collapse of the liquid line 26 due to the pressing.

Thereafter, the liquid line 26 is evacuated through the inlet 34c (see FIG. 15) with an unillustrated vacuum pump.

Thereafter, water as the working fluid C is poured into the liquid line 26 through the inlet 34c, and then the inlet 34c is sealed.

Thus, the fabrication of the loop heat pipe 22 according to the present embodiment is completed.

Figure 17:
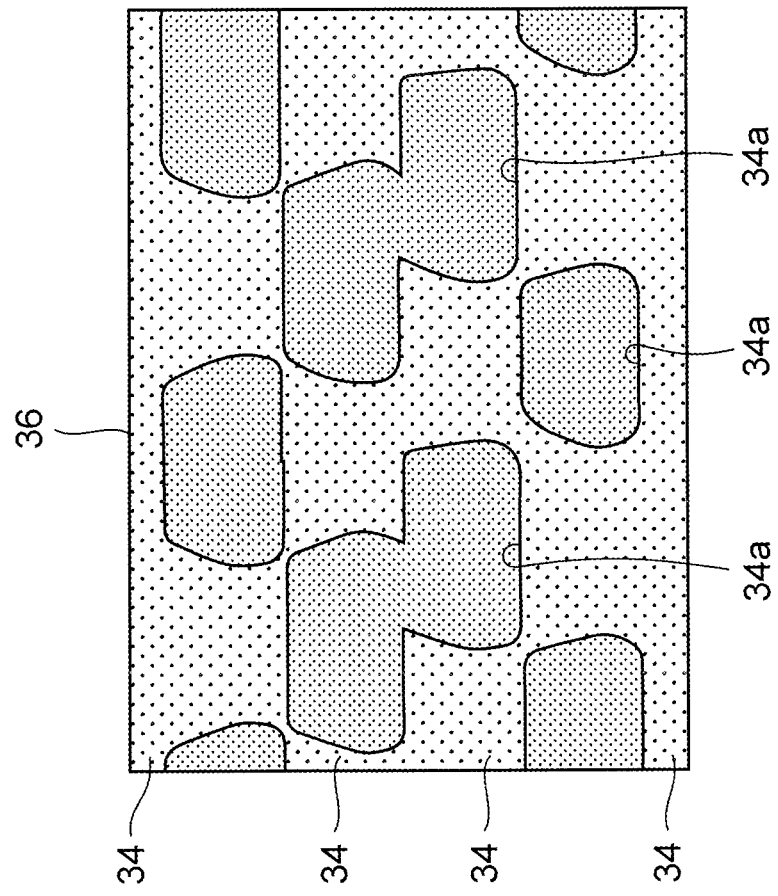
FIG. 17 is a cross-sectional view drawn based on an SEM (Scanning Electron Microscope) image of a portion that corresponds to the porous body of the loop heat pipe according to the present embodiment.

FIG. 17 is a cross-sectional view drawn based on an SEM (Scanning Electron Microscope) image of the portion corresponding to the porous body 36 in the loop heat pipe 22.

As illustrated in FIG. 17, the metallic layers 34 are integrated with one another as a result of the diffusion bonding, and the interfaces of the metallic layers 34 are disappeared.

According to the present embodiment described above, by providing the porous body 36 of a columnar shape in the liquid line 26, the working fluid C in the liquid line 26 is guided to the evaporator 23 by the capillary force generated in the porous body 36. Thus, it is possible to suppress the backward flow of the working fluid C from the evaporator 23 to the liquid line 26.

The porous body 36 provided in the columnar shape can prevent the liquid line 26 from collapsing.

Moreover, the multiple metallic layers 34 are stacked to manufacture the loop heat pipe 22. Therefore, it is possible to thin the loop heat pipe 22 to such a degree that the loop heat pipe 22 can be housed in a smartphone, a tablet computer, and the like.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A loop heat pipe comprising:
an evaporator configured to vaporize a working fluid;
a condenser configured to turn the vaporized working fluid from the evaporator into a liquid;
a liquid line connecting the condenser and the evaporator and configured to transfer the liquid from the condenser to the evaporator;

a porous body provided in a columnar shape in a cross-sectional view of the liquid line and disposed in the liquid line, and outer walls of the porous body being apart from inner walls of the liquid line to form channels between the outer walls of the porous body and the inner walls of the liquid line, respectively; and a vapor line connecting the evaporator and the condenser and configured to transfer the vaporized working fluid from the evaporator to the condenser, and the vapor line forming a loop together with the liquid line, wherein the porous body includes a first layer, a second layer stacked on the first layer, and a third layer stacked on the second layer, the first layer includes a plurality of holes penetrating the first layer, the second layer includes a plurality of holes penetrating the second layer, and the third layer includes a plurality of holes penetrating the third layer, a first hole of the plurality of holes in the first layer and a second hole of the plurality of holes in the second layer are located at positions that are different from each other in a plan view, the first hole and the second hole overlap each other in the plan view, a third hole of the plurality of holes in the first layer and the second hole are located at positions that are different from each other in the plan view, the second hole and the third hole overlap each other in the plan view, a fourth hole of the plurality of holes in the second layer and the third hole are located at positions that are different from each other in the plan view, the third hole and the fourth hole overlap each other in the plan view, the first hole, the second hole, the third hole, and the fourth hole are lined in this order along with a length direction of the liquid line in the plan view, a fifth hole of the plurality of holes in the third layer and the second hole are located at positions that are different from each other in the plan view, the second hole and the fifth hole overlap each other in the plan view, the first layer, the second layer, and the third layer are stacked along with a first direction crossing the length direction of the liquid line, and the second hole and the fifth hole are lined along with a second direction crossing both the first direction and the length direction of the liquid line, and a path of the working fluid branches off at the second hole to both the third hole and the fifth hole.

2. The loop heat pipe according to claim 1, wherein the porous body extends along the liquid line.

3. The loop heat pipe according to claim 1, wherein the evaporator, the condenser, the liquid line, the vapor line, and the porous body are formed to include the first layer, the second layer, and the third layer.

4. The loop heat pipe according to claim 1, wherein a pillar is provided inside the vapor line.

5. The loop heat pipe according to claim 4, wherein a planar shape of the pillar is a linear shape extending along the vapor line.

6. The loop heat pipe according to claim 4, wherein the condenser comprises a flow path connected to the liquid line and the vapor line, and the pillar is also provided in the flow path.

7. An electronic device comprising:

a heat generating component; and a loop heat pipe configured to cool the heat generating component, wherein the loop heat pipe comprises:

an evaporator configured to vaporize a working fluid with a heat of the heat generating component;

a condenser configured to turn the vaporized working fluid from the evaporator into a liquid;

a liquid line connecting the condenser and the evaporator and configured to transfer the liquid from the condenser to the evaporator;

a porous body provided in a columnar shape in a cross-sectional view of the liquid line and disposed in the liquid line, and outer walls of the porous body being apart from inner walls of the liquid line to form channels between the outer walls of the porous body and the inner walls of the liquid line, respectively; and a vapor line connecting the evaporator and the condenser and configured to transfer the vaporized working fluid from the evaporator to the condenser, and the vapor line forming a loop together with the liquid line, wherein the porous body includes a first layer, a second layer stacked on the first layer, and a third layer stacked on the second layer, the first layer includes a plurality of holes penetrating the first layer, the second layer includes a plurality of holes penetrating the second layer, and the third layer includes a plurality of holes penetrating the third layer, a first hole of the plurality of holes in the first layer and a second hole of the plurality of holes in the second layer are located at positions that are different from each other in a plan view, the first hole and the second hole overlap each other in the plan view, a third hole of the plurality of holes in the first layer and the second hole are located at positions that are different from each other in the plan view, the second hole and the third hole overlap each other in the plan view, a fourth hole of the plurality of holes in the second layer and the third hole are located at positions that are different from each other in the plan view, the third hole and the fourth hole overlap each other in the plan view, the first hole, the second hole, the third hole, and the fourth hole are lined in this order along with a length direction of the liquid line in the plan view, a fifth hole of the plurality of holes in the third layer and the second hole are located at positions that are different from each other in the plan view, the second hole and the fifth hole overlap each other in the plan view, the first layer, the second layer, and the third layer are stacked along with a first direction crossing the length direction of the liquid line, and the second hole and the fifth hole are lined along with a second direction crossing both the first direction and the length direction of the liquid line, and a path of the working fluid branches off at the second hole to both the third hole and the fifth hole.

8. The loop heat pipe according to claim 1, wherein the first hole and the third hole do not contact with each other in the first layer, and the second hole and the fourth hole do not contact with each other in the second layer.

9. The loop heat pipe according to claim 1, wherein
the porous body further includes a fourth layer stacked on the third layer,
the fourth layer includes a plurality of holes penetrating the fourth layer,
a sixth hole of the plurality of holes in the fourth layer and the fifth hole are located at positions that are different from each other in the plan view,
the fifth hole and the sixth hole overlap each other in the plan view,
a seventh hole of the plurality of holes in the third layer and the sixth hole are located at positions that are different from each other in the plan view,
the sixth hole and the seventh hole overlap each other in the plan view,
an eighth hole of the plurality of holes in the fourth layer and the seventh hole are located at positions that are different from each other in the plan view,
the seventh hole and the eighth hole overlap each other in the plan view,
the fifth hole, the sixth hole, the seventh hole, and the eighth hole are lined in this order along with the length direction of the liquid line in the plan view,
the fourth hole and the seventh hole overlap each other in the plan view, and
the fourth hole and the seventh hole are lined along with the direction crossing the length direction of the liquid line in the plan view.

10. The loop heat pipe according to claim 9, wherein
the working fluid flows in the liquid line from the condenser to the evaporator by capillary force induced by the porous body.

* * * * *